United States Patent [19]

Wan et al.

[11] Patent Number: 4,807,004
[45] Date of Patent: Feb. 21, 1989

[54] TIN OXIDE CCD IMAGER

[75] Inventors: Chang-Feng Wan, Dallas; Yingsheng Tung, Plano; Steven N. Frank, McKinney, all of Tex.

[73] Assignee: Texas Instruments Incorporated, Dallas, Tex.

[21] Appl. No.: 935,664

[22] Filed: Nov. 26, 1986

[51] Int. Cl.[4] .................................. H01L 29/78
[52] U.S. Cl. ................................ 357/24; 156/643; 358/213.11; 437/53
[58] Field of Search ................ 357/24; 27/578; 156/643; 358/213

[56] References Cited

U.S. PATENT DOCUMENTS

| | | | |
|---|---|---|---|
| 2,544,444 | 10/1985 | Chang | 156/643 |
| 3,757,733 | 9/1973 | Reinberg | 118/49.5 |
| 4,024,563 | 5/1977 | Tasch, Jr. | 357/24 |
| 4,027,382 | 6/1977 | Tasch, Jr. | 29/578 |
| 4,140,814 | 2/1979 | Hynecek | 427/39 |
| 4,229,752 | 10/1980 | Hynecek | 357/24 |
| 4,242,694 | 12/1980 | Koike et al. | 357/24 |
| 4,280,141 | 7/1981 | McCann et al. | 357/24 |
| 4,708,766 | 11/1987 | Hynecek | 156/643 |
| 4,716,447 | 12/1987 | Savoye | 357/24 |

Primary Examiner—Robert S. Macon
Attorney, Agent, or Firm—Rodney M. Anderson; Leo N. Heiting; Melvin Sharp

[57] ABSTRACT

A novel process for fabricating a CCD imager arrray (10) having a tin oxide electrode monolayer (18) is disclosed. The process includes a low pressure chemical vapor deposition step using tetramethyltin and oxygen, and an ion implantation step that increased conductivity of the tin oxide electrodes to as high as 700 ohm$^{-1}$ cm$^{-1}$.

44 Claims, 5 Drawing Sheets

EXAMPLE 1

EXAMPLE 2

EXAMPLE 3

EXAMPLE 4

EXAMPLE 5

EXAMPLE 6

EXAMPLE 7

EXAMPLE 8

EXAMPLE 9

EXAMPLE 10

TIN OXIDE CCD IMAGER

TECHNICAL FIELD OF THE INVENTION

This invention relates in general to fabricating integrated circuits, and more particularly relates to the fabrication of CCD imagers having tin oxide electrodes.

BACKGROUND OF THE INVENTION

It is known in the art to employ charge coupled devices (CCDs) in optical array imagers. CCD imager arrays conventionally comprise a semiconductor substrate, such as silicon, and a gate insulator layer disposed on one surface of the semiconductor substrate. A plurality of electrodes are formed on the gate insulator layer in order to store and transport charge accumulated in the adjacent substrate.

Several varieties of CCD imagers have been developed. The first kind developed was the three-phase CCD imager array, wherein every third electrode was connected to a particular voltage clock, there being three voltage clocks in all. In order for this CCD imager array to properly operate, the electrodes must be spaced relatively close together, such as 1 micron apart, in order to assure that the charge accumulated in a well underneath any particular electrode gate could be transported to the next well formed underneath an adjacent electrode.

Before the present invention, it had not been possible to form a three-phase CCD imager array from a single electrode layer with submicron gap geometries. Previously, it had been attempted to form a plurality of electrodes from a single layer of polysilicon, the electrodes being selectively doped areas of the layer. It was discovered, however, that when the layer was annealed, the dopants in the doped polysilicon electrodes would migrate out of the desired areas and cause increased and variable conductivity between the electrodes. Certain prior art CCD imagers would operate at room temperature, but could not operate in cold conditions.

In order to avoid these problems, conventional three-phase CCD imagers have been built with a multilayer electrode structure, wherein successive layers of electrodes are deposited and then insulated from the next electrode level. Subsequent to the first level, the remaining levels partially overlap the previously deposited levels in order to maintain a continuity of electrode surface relative to the semiconductor substrate. For each additional level fabricated, problems of registration and manufacturing complexity increase.

Another conventional solution to this problem has been the introduction of two-phase, one-and-one-half-phase, and virtual-phase CCD imagers, each of which have progressively fewer electrodes but a progressively more complex, differentially doped semiconductor substrate. While the problem of shorts in between the electrodes is progressively alleviated in these structures, problems associated with correct doping conditions and relative registration of the doped areas increase.

Tin oxide has conventionally been employed to fabricate CCD imagers. However, the particular advantageous properties of tin oxide relative to polysilicon have not been fully exploited. Further, the conventional steps for depositing and doping tin oxide are less than optimum in terms of their rate of production, quality and reproducibility. In particular, in situ or predoping techniques have been employed that raise the conductivity of tin oxide electrodes up to acceptable levels, but these techniques require a subsequent tin oxide etching step. A need therefore exists in the industry to develop a tin oxide CCD imager that can be fabricated in a relatively short time with minimum number of process steps, that has a high quality, and that takes advantage of the inherent properties of tin oxide.

SUMMARY OF THE INVENTION

It has been discovered that tin oxide retains dopant well during successive annealing steps. Thus, once dopant is fixed in place in preselected regions of tin oxide structures, it will not migrate undesirably out of these regions. Further, tin oxide has a higher transparency than polysilicon, and has, in its undoped condition, a lower conductivity.

These advantageous properties of tin oxide have been used in the present invention to provide a tin oxide CCD imager array with a simplified structure. According to the invention, a gate insulator layer is formed on a semiconductor substrate as a first step in fabricating such a CCD imager array. Next, a normally insulative layer, preferably made out of tin oxide, is formed on the gate insulator layer. A particularly preferred step for forming this layer is a low pressure chemical vapor deposition of tin oxide from tetramethyltin and oxygen under a set of conditions designed to produce a maximum yield.

Next, a plurality of conductive electrodes that each define a row of charge coupled devices is formed in the normally insulative layer, as horizontally spaced by electrode gaps of a predetermined width. The electrodes and the gaps are formed by selectively doping the normally insulative layer. A preferred process for doping the electrode layer is by implantation, which is herein shown to be particularly effective in obtaining tin oxide electrodes of high conductivity. Finally, an anneal step follows the doping process. Using the process disclosed by the invention, a three-phase tin oxide array having a simplified structure, and, therefore, an increased level of quality has been fabricated. The process of the invention is however also applicable to other types of CCD imager arrays, such as virtual-phase CCD imager arrays, as well as other integrated circuits employing tin oxide.

BRIEF DESCRIPTION OF THE DRAWINGS

The invention and its advantages may be more thoroughly understood with reference to the following detailed description taken in conjunction with the drawings, in which.

DETAILED DESCRIPTION

Figure 1:
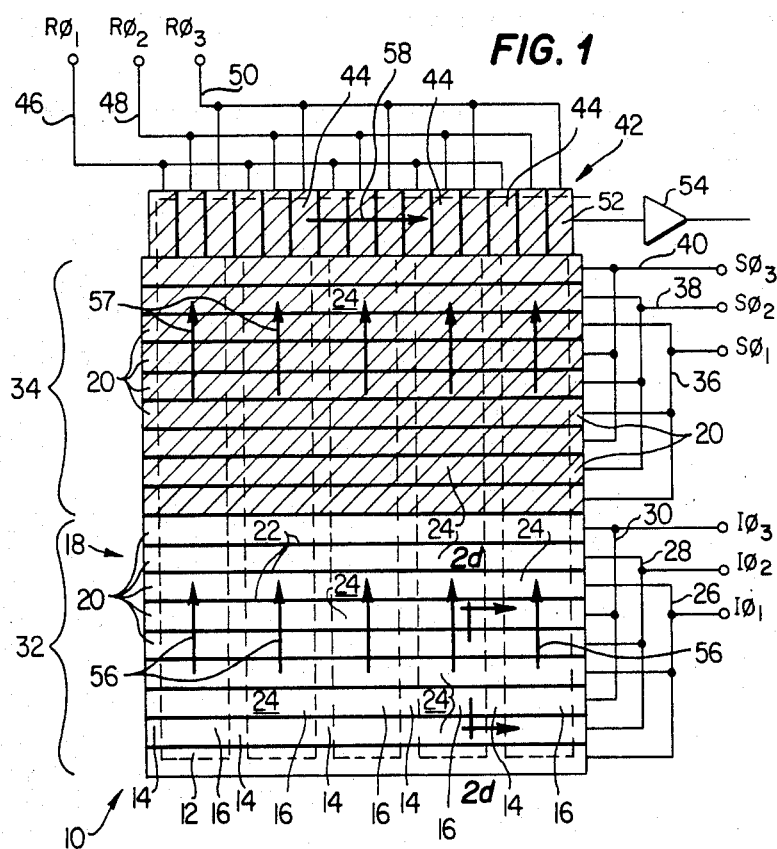
FIG. 1 is a part plan, part schematic view of a three-phase CCD imager array fabricated according to the invention.

Referring first to FIG. 1, a three-phase CCD imager array is indicated generally at 10. CCD imager array 10 includes a semiconductor substrate 12. A plurality of channel stop regions 14 are deeply and selectively implanted into semiconductor substrate 12 in order to define a plurality of rows 16 of CCD cells. The channel stop implant is conventionally one of the first steps in fabricating CCD imager arrays. As the next step in the process, if desired, a buried channel layer (not shown) can be implanted into the semiconductor substrate. Next, a gate insulator layer (see FIGS. 2a-2d), such as one comprised of oxide, nitride, or a combination of these or other materials, is formed across the surface of semiconductor substrate 12. Then, a tin oxide layer 18 is formed on the gate insulator layer by a process that shall be later described.

The tin oxide layer 18 is next selectively doped in order to form a plurality of electrodes 20, each electrode formed for a respective column of CCD cells. Electrodes 20 have gaps of a predefined width in between them, here schematically represented by lines 22 dividing electrodes 20. The electrodes 20, and the channel stop regions 14 orthogonal to electrodes 20, together define a plurality of individual CCD cells 24.

CCD imager array 10 further includes a plurality of image clock leads 26-30, connecting image clock sources $I\phi_1$-$I\phi_3$ to respective interdigitated thirds of the tin oxide electrodes 20. Each image clock is connected to every third electrode, such that two electrodes connected to other image clocks separate electrodes connected to the same clock. The electrodes are successively connected to the image clocks in the following repeating pattern $I\phi_1$, $I\phi_2 I\phi_3$, $I\phi_1$. . . etc.

Array 10 is subdivided into an image subarray 32 and a storage subarray 34. Storage subarray 34 is, in a manner similar to image subarray 32, provided with a series of storage clocks $S\phi_1$-$S\phi_3$, connected to respective interdigitated thirds of the electrodes by leads 36-40. Array 10 further comprises a readout register 42 that is formed from a plurality of readout cells 44 formed adjacent to one end of storage subarray 34. Every third readout cell 44 is connected to a particular register voltage clock $R\phi_1$-$R\phi_3$ in a manner similar to the connection of the image clocks to the image subarray 32 and the storage clocks to the storage subarray 34. A last readout cell 52 is connected to an output 54.

In operation, light incident on image subarray 32 causes charge to be accumulated in the CCD cells formed underneath electrodes 20. At selected intervals, image clocks $I\phi_1$-$I\phi_3$ are operated in order to transfer the accumulated charges in the direction of arrows 56 to adjacent CCD cells. The charges are eventually transferred to storage subarray 34. Storage subarray 34 in turn stores the charges sensed by image subarray 32. Storage subarray 34 in this embodiment is shielded from incident light by means such as an aluminum sheet (not shown) over the array. Clocks $S\phi_1$-$S\phi_3$ operate to transport the charges stored in storage subarray 34 in the direction of arrows 57 into readout register 42. Readout clocks $R\phi_1$-$R\phi_3$ in turn operate to serially transport the charge stored in readout cells 44 in the direction of arrow 58 to output port 54.

Turning now to FIGS. 2a-2d, successive steps in a process for fabricating a three-phase CCD imager according to the invention are shown. The description of many conventional process steps, such as clean-ups and the growth of oxides stripped before the gate oxide is grown, are omitted for purposes of brevity. The section shown corresponds to the section taken on lines 2d—2d of FIG. 1. The CCD imager array is formed at a face of the semiconductor substrate 12, which may be comprised of silicon. The three-phase CCD imager illustrated has no differentially doped regions in its semiconductor substrate 12, but these can easily be provided according to conventional doping techniques, such as ion implantation, before subsequent steps are performed. For instance, a buried channel (not shown) can be implanted into the semiconductor substrate 12 so as to be spaced from its upper surface.

A gate insulator layer 60, such as oxide, is next formed on semiconductor substrate 12. Gate insulator layer 60 can also be comprised of oxide, nitride, a combination of nitride and oxide, or other conventional materials, and is formed in a manner known in the art. As formed from oxide, one method of forming insulator layer 60 is to form it thermally in a controlled oxygen environment.

Next, a layer 18 of tin oxide is deposited over layer 60. Layer 18 may be deposited by several methods, but a preferred method is by low-pressure chemical vapor deposition. In this preferred process step, a low pressure reactant mixture of tetramethyltin and oxygen is used, with a nitrogen pressure control, to deposit tin oxide on the surface.

This low pressure chemical vapor deposition (LPCVD) process is preferably performed in a horizontal hotwall furnace, wherein a plurality of slices each having a gate insulator layer 60 thereon are arranged orthogonally to the gas flow on a quartz boat with approximately one-eighth inch spacing between them. The temperature is maintained at less than 600° C., above which a spontaneous reaction of tetramethyltin and the oxygen occurs in the gas phase, with a white powder then forming on the quartz surfaces inside the reactor. Preferably, the temperature is selected from a range of about 450° to about 550° C., with an optimum deposition rate occurring at about 550° C. The molar ratio of tetramethyltin to oxygen can be maintained at a value selected from the range of about 0.06 to about 0.60. A preferred range is about 0.07 to about 0.15 with optimum results occurring at ratios ranging from about 0.09 to about 0.11. The pressure at which the LPCVD process can occur ranges from 0.3 to about 1.1 torr. More preferably, the pressure should be maintained at 0.7 to 1.1 torr, and most preferably the pressure is maintained at about 1.1 torr, at which a high, even deposition rate is obtained. The pressure should be reduced to about 0.7 torr where very high concentrations of tetramethyltin relative to oxygen are used, such as above fifty percent, in order to avoid a spontaneous gas-phase reaction that forms white powder deposits. The reaction mixture is introduced into the horizontal hotwall furnace at a flux per unit cross-sectional area of about 0.16 to about 1.1 standard $cm^3$/minute/$cm^2$ of reactor cross-section.

In one embodiment, the hotwall horizontal furnace has a 20 inch heating zone. A temperature gradient of about 20° C. from one end of the heating zone to the other is maintained in order to compensate for the loss in the deposition rate due to downstream reactant depletion. As operated according to the above parameters, a rate of deposition of between about 40 and about 115 angstroms per minute is obtained. An optimum deposition rate is achieved at a reactor temperature of about 550° C., a pressure of about 1.1 torr, a standard flux of gas reactants per unit cross-sectional area of the reactor in the range of about 0.45 $scm^3$/min/$cm^2$ to about 0.70 $scm^3$/min/$cm^2$, and a tetramethyltin to oxygen molar ratio ranging from about 0.09 to about 0.11.

Depending on the desired thickness of the tin oxide layer, the time of this step lasts from about 30 to about 90 minutes. Using the above conditions, excellent uniformity was obtained, such that the deposition thickness varied no more than 5%. A preferred tin oxide electrode layer thickness is approximately 2600 angstroms.

At this stage, a light implant of the entire tin oxide layer 18 maybe performed in order to adjust the conductivity of the interelectrode gaps (described below). The parameters of this light implant will vary according to the width of the gaps the wider the gap, the more conductive it should be.

Figure 2A:
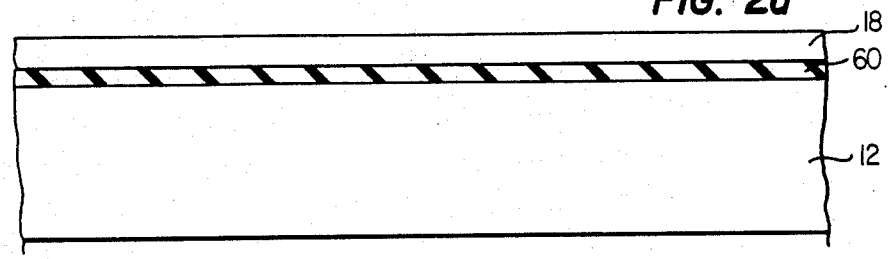
FIGS. 2a–2d are part-schematic, part sectional views of successive stages in a preferred CCD imager array fabrication process according to the invention, the section corresponding to a section taken along lines 2d—2d of FIG. 1.
Figure 2B:
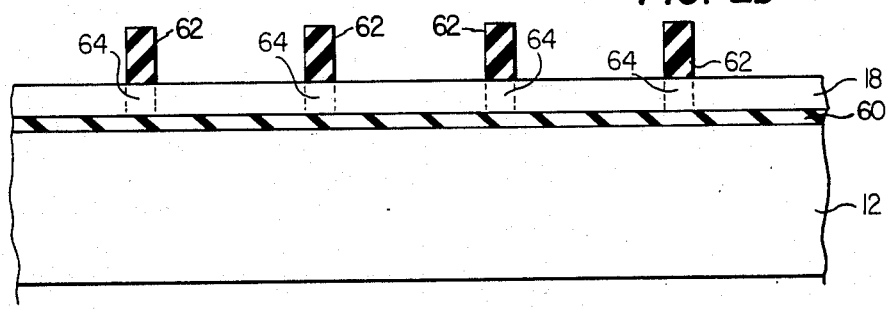

Turning now to FIG. 2b, a layer 62 of photoresist is spun on tin oxide layer 18 and is patterned in order to mask underlying gap regions 64. For effective transmission of charge in between clocked well areas of the completed three phase CCD imager, gap regions 64 should be no more than, and preferably less than, one micron in width. Previous to depositing the photoresist, a light implant step may be performed to adjust the sheet resistance of the gap regions.

Figure 2C:
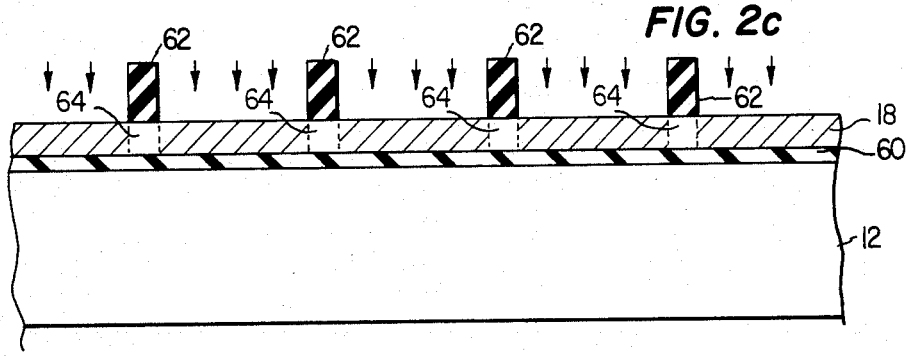

Referring to FIG. 2c, a selective doping step of the invention is next employed, which is preferably an ion implantation step. An ion implantation is employed in order to overcome several disadvantages of other doping techniques. For instance, various methods are known to dope the tin oxide before deposition by introducing the dopant into the gas reactant mixture. For example, phosphine has been used as a reactant where it is desired to dope layer 18 with phosphorus. In conjunction with using these in situ techniques, however, it is necessary to perform a subsequent etch of tin oxide layer 18 in order to form electrodes 20, because the whole layer is doped in contrast to the selective doping techniques of the invention. Since tin oxide is a very refractory material, this can be accomplished only with great difficulty. Dopant diffusion techniques have also been tried with tin oxide, but again because of the extremely refractory nature of tin oxide, have been unable to produce tin oxide electrodes with satisfactorily high conductivities. Tin oxide in an undoped condition has a conductivity of approximately 8 $ohm^{-1} cm^{-1}$ and this needs to be raised to about at least 285 $ohm^{-1} cm^{-1}$ in order to get tin oxide electrodes of satisfactory conductivity.

The ion implantation step of the invention has the further advantage of being simpler and more reproducible. It is difficult to achieve reproducible results with in situ doping, as the dopant level in the deposited layer is very sensitive to the deposition conditions employed.

Preferred process parameters for the ion implantation step are as follows. The dopant may be selected from phosphorus, arsenic, fluorine, boron difluoride, and boron, with phosphorus being preferred. Satisfactory results have been achieved with ion implant concentrations in the range of about $1 \times 10^{15} cm^{-2}$ to about $10^{16} cm^{-2}$. A preferred implantation dose is selected from the range of about $5 \times 10^{15} cm^{-2}$ to about $1 \times 10^{16} cm^{-2}$, with optimum conductivity achieved in a range of $7 \times 10^{15} cm^{-2}$ to $1 \times 10^{16} cm^{-2}$. Implant concentrations much in excess of $1 \times 10^{16} cm^{-2}$ actually cause the sheet resistance of the doped layers to rise, possibly due to the formation of SnO or amorphous $SnO_2$ on the surface. Satisfactory implant energies range from about 60 to about 195 keV. A preferred range is 80 to 195 keV, with a particularly preferred implantation energy range for phosphorus being 120 to 150 keV.

After the implantation step, an annealing step is performed. This step is performed under an annealing atmosphere such as oxygen or nitrogen. The annealing temperature should not exceed approximately 950° C. under an ambient oxygen atmosphere, and should be less than 900° C. under an ambient nitrogen atmosphere. In the last instance, if an annealing temperature of 900° C. or more is used, a spontaneous reduction reaction from tin dioxide to tin monoxide will occur, leaving a grayish haze on the tin oxide surface. The annealing time should be in the range of about 50 to about 200 minutes.

After this anneal step, the conductivity of the tin oxide electrodes thus formed ranges from about 260 to about 420 $ohm^{-1} cm^{-1}$. In order to increase the conductivity further, a second phosphorus implant and anneal is preferably performed. The second implant is preferably performed at a phosphorus implant concentration of approximately $5 \times 10^{15} cm^{-2}$ and at an implantation energy of approximately of 150 to 180 keV. A second anneal step is then performed that is similar to the first. Using the second phosphorus implant and anneal, conductivities ranging from about 480 to about 700 $ohm^{-1} cm^{-1}$ were obtained.

The sheet resistance of the tin oxide electrodes 20 can be further reduced if they are deposited, implanted and annealed in multiple layers. Using a double layer structure as an example, the preferred thickness of the combined layers would be approximately 5200 angstroms. According to this embodiment, the first layer is deposited, implanted with a dopant such as phosphorus and annealed. The preferred implantation energy is 120 to 150 keV, with a preferred dopant concentration being about $5 \times 10^{15} cm^{-2}$. The second layer is implanted with a dose of ions of about $5 \times 10^{15} cm^{-2}$, with an implantation energy in the range of about 60 to about 150 keV. Under these conditions, final sheet resistances of the bilayer structures from about 45 to about 100 ohms per square were obtained, corresponding to conductivities in the range of about 200 to about 410 $ohm^{-1} cm^{-1}$. Where implantation energies were varied within the preferred range of 90 keV to 150 keV, final sheet resistances in the range of about 45 to about 70 ohms per square were obtained, for conductivities of about 275 to about 410 $ohm^{-1} cm^{-1}$.

One of the advantageous properties of tin oxide relative to polysilicon is its ability to prevent implanted ions from diffusing into adjacent nonimplanted areas. Thus, under the annealing conditions thus described, little or no diffusion of phosphorus into electrode gaps 64 is obtained This results in extremely clean definition between the conductive electrodes 20 and the insulative or less conductive gaps 64. The conductivity of gap 64 remains on the order of one to ten $ohm^{-1} cm^{-1}$, while the final conductivity of the electrodes 20 is in the range of about 285 to about 700 $ohm^{-1} cm^{-1}$. Further, since tin oxide is such a highly refractory material and completely covers the array, a further, passivating layer is not necessary.

Figure 2D:
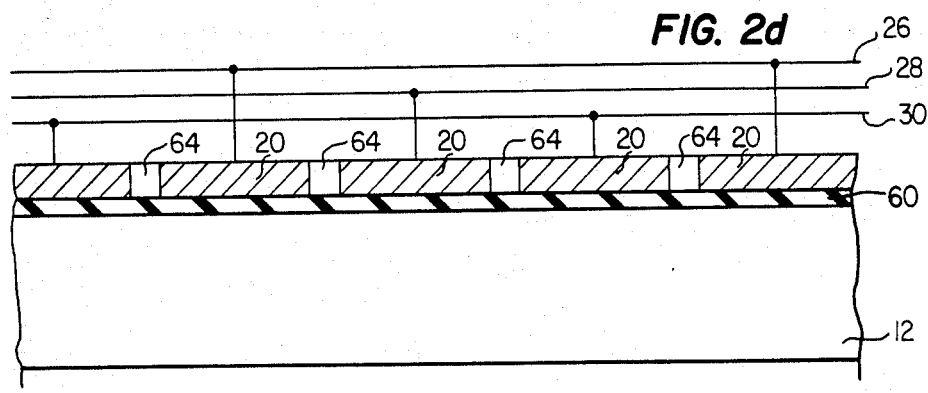

Referring to FIG. 2d, a metallization step of the process is schematically illustrated. Each third electrode 20 is connected to a particular clock line 26, 28, or 30. The actual physical connections between the tin oxide and the metal are made off of the array proper, as is shown in FIG. 1.

The following examples are given to demonstrate the LPCVD and ion implantation/anneal process steps of the invention.

EXAMPLE 1

A low-pressure chemical vapor deposition step according to the invention was performed. A horizontal hotwall LPCVD furnace system built by Thermco was used that had an interior diameter of 25 cm. Tetramethyltin and oxygen were introduced into the system by mass flow controllers. Nitrogen was used for purging the mass flow controllers and gas lines. Pressure was varied by bleeding a regulated amount of nitrogen into the vacuum line The slices on which the tin oxide was to deposited were stacked vertically on a quartz boat with a one-eighth inch spacing among them. Eight buffers were added to the front and back sides of the slices, and the loading of the reactor averaged 23 slices. The temperature profile was graded by 20° C. over a 20-inch heating zone to compensate loss in the deposition rate due to downstream effects.

In this first example, the average temperature inside the reactor was maintained at 550° C., and the oxygen flow rate was held at 208 standard cubic centimeters per minute.

Figure 3:
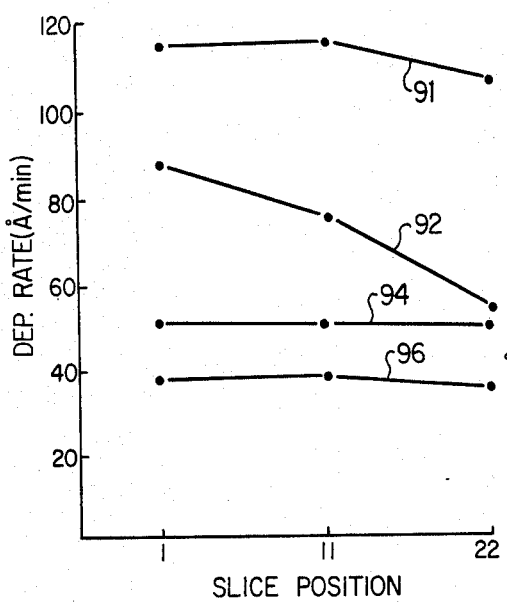
FIG. 3 is a graph of tin oxide deposition rate versus slice position in a horizontal reactor, corresponding to Example 1.

FIG. 3 is a graph of deposition rate versus slice position on the quartz boat for four sets of conditions. For curve 91, the pressure inside the reactor was maintained at 1100 millitorr, and the flow rate of tetramethyltin (TMT) was held at 30 standard cubic centimeters per minute (sccm). For curve 92, the pressure inside the reactor was 1100 millitorr, but the TMT flow rate was halved to 15 sccm. Curve 94 was obtained when the reactor pressure was established at 550 millitorr, with a TMT flow rate of 30 sccm. Finally, curve 96 resulted from a reactor pressure of 550 millitorr and a TMT flow rate of 15 sccm.

As can be seen, good uniformity and deposition rate per slice position was obtained, with the exception of a TMT flow rate of 15 sccm at 1100 millitorr. It appears that the TMT concentration available to be deposited on the substrate was exhausted as the reactant gas moved through the reactor. Therefore, in order to obtain good uniformity, the relative molar ratio of TMT to oxygen should be maintained at no less than about 10% in order to achieve a good uniform deposition rate at pressures around 1100 millitorr.

EXAMPLE 2

Figure 4:
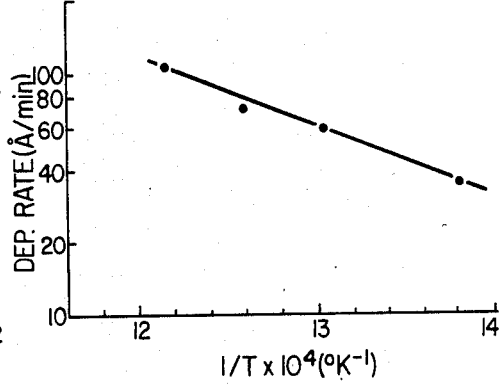
FIG. 4 is a graph of tin oxide deposition rate versus the inverse of the reactor temperature, corresponding to Example 2.

The temperature dependence of the growth rate of the tin oxide films was studied at five different temperatures (450° C., 500° C., 521° C., 550° C., 600° C., and 650° C.). At or above 600° C., a spontaneous reaction of the TMT with oxygen occurred in the gas phase, which was evidenced by low deposition rates and the formation of a white powder on the quartz surfaces. FIG. 4 is an Arrhenius plot of deposition rate versus the inverse of temperature in degrees Kelvin. The pressure was maintained at 1100 millitorr inside the reactor, with the TMT flow rate established at 30 sccm and the oxygen flow rate at 208 sccm. Under these conditions, an optimum deposition rate of about 110 angstroms per minute was obtained at a reactor temperature of 550° C.

EXAMPLE 3

Figure 5:
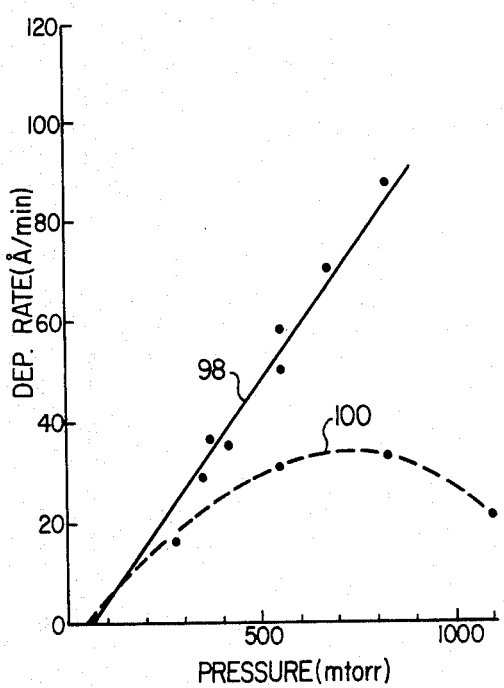
FIG. 5 is graph of tin oxide deposition rate versus reactor pressure, corresponding to Example 3.

An LPCVD step using tetramethyltin and oxygen was performed as per the above examples, except that pressure was varied in order to determine its effect on deposition rate. In FIG. 5, the curve 98 results when the oxygen pressure is held at 312 sccm, with the TMT flow rate held at 30 sccm and the average temperature inside the reactor held at 550° C. Under these conditions, the deposition rate varied linearly with an increase in pressure.

Curve 100 illustrates the effect of reducing oxygen concentration to about 52 sccm, the other parameters remaining the same as for curve 98. The deposition rate under these conditions peaked at a pressure about 700 millitorr and decreased thereafter. This is due once again to a spontaneous gas-phase reaction that results in the accumulation of white powdery deposits on the quartzware. This gas phase reaction was probably induced by the relatively high $TMT:O_2$ concentrations in the gas stream.

EXAMPLE 4

Figure 6:
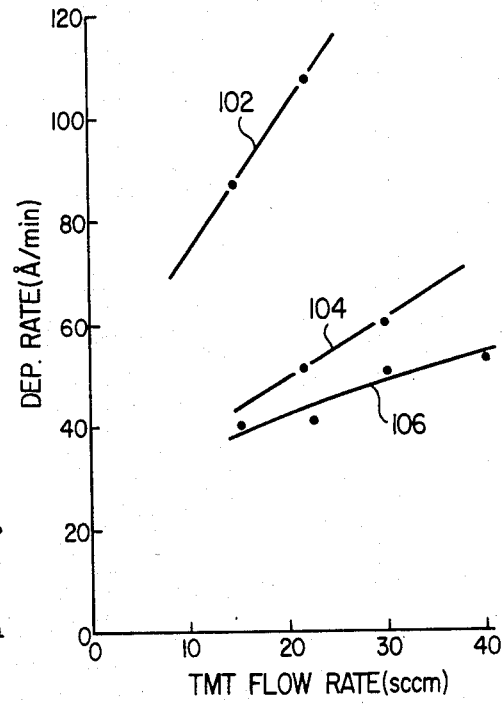
FIG. 6 is a graph of tin oxide deposition rate versus tetramethyltin flow rate, corresponding to Example 4.

In this example, the temperature inside the reactor was held constant while the pressure, oxygen flow rate and TMT flow rate were varied in order to determine the nature of the deposition rate-limiting mechanism. Referring to FIG. 6, three curves 102–106 are graphed as a function of deposition rate versus TMT flow rate. Data for curves 102–106 were all obtained for a temperature of 550° C. For curve 102, the oxygen flow rate was established at 208 sccm and the pressure was maintained at 1100 millitorr inside the reactor. The results indicate a relatively high deposition rate relative to the amount of TMT flowing into the reactor, and that the reaction is TMT transport controlled. For curve 104, the oxygen flow rate was established at 312 sccm and the pressure inside the reactor was maintained at 550 millitorr. Finally, for curve 106, the pressure was held at 550 millitorr and the oxygen flow rate was established at 208 sccm. Curves 104 and 106 demonstrate only a weak relation of TMT flow rate on the deposition. Curve 102 also demonstrates that a high deposition rate is established when the TMT to oxygen molar ratio of in the reactant gas is approximately 11%.

EXAMPLE 5

Figure 7:
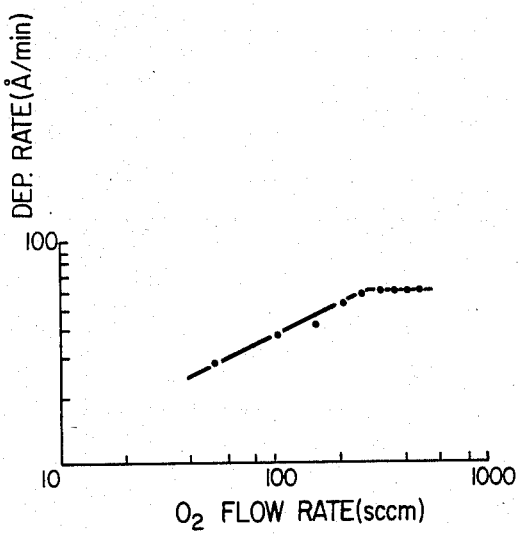
FIG. 7 is a graph of tin oxide deposition rate versus oxygen flow rate, corresponding to Example 5.

In this example, the temperature, pressure, and TMT flow rate were held constant and the oxygen flow rate was varied. FIG. 7 is a log/log graph of deposition rate versus $O_2$ flow rate. At $O_2$ flow rates lower than 280 sccm, the relation between deposition rate and oxygen flow rate is approximately one-half order. However, at flow rates higher than 280 sccm, the deposition rate does not increase further. The curve represents data for a temperature of 550° C., a pressure of 550 millitorr, and a TMT flow rate of 30 sccm. At least at this temperature and pressure, it appears that the optimum molar ratio of TMT to $O_2$ in the reactant gas is about 11%. since lower concentrations result in smaller deposition rates and higher concentrations produce no further advance in deposition rate.

For the following examples, undoped tin oxide films were deposited on wafers in a Thermco LPCVD system using tetramethyltin and oxygen as the reactant gases. The thicknesses of the films were approximately 2600 angstroms.

EXAMPLE 6

Figure 8:
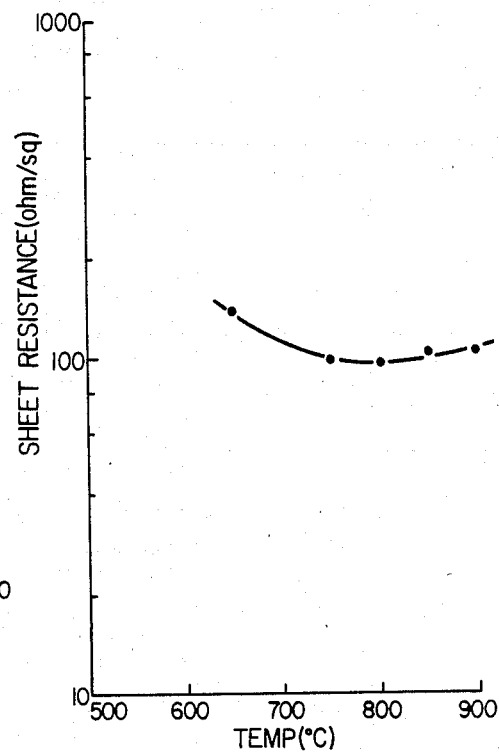
FIG. 8 is a graph of tin oxide sheet resistance versus annealing temperature, corresponding to Example 6.

In this example, phosphorus was implanted into tin oxide films as prepared at an implantation dose of $1 \times 10^{16}$ cm$^{-2}$, and an implantation energy of 195 keV. An annealing step was then performed. The annealing period was held at 70 minutes, and the temperature was varied. FIG. 8 shows the variation between sheet resistance and temperature for these conditions. The optimum annealing temperature for these conditions is shown to be approximately 800° C.

EXAMPLE 7

Figure 9:
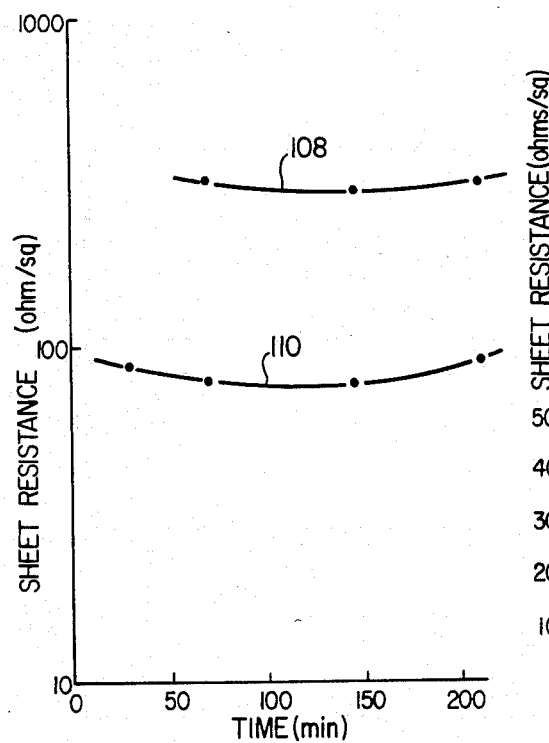
FIG. 9 is a graph of tin oxide sheet resistance versus time, corresponding to Example 7.

In this example, a first set of tin oxide films was implanted with phosphorus at a dose of $2 \times 10^{16}$ cm$^{-2}$ and an implantation energy of 150 keV, and a second set of films was implanted with phosphorus at a dose of $1 \times 10^{16}$ cm$^{-2}$ but at a higher implantation energy of 195 keV. Subsequently, an anneal step was performed at 800° C. FIG. 9 plots out these sets of films, the first set being represented by curve 108 and the second set being represented by curve 110. The annealing time is shown to have only a small effect on the resultant sheet resistance of the implanted films, but a preferred range under these conditions is about 125 to 175 minutes. This example also shows the detrimental effect of increasing dosage much above $1 \times 10^{16}$ cm$^{-2}$.

EXAMPLE 8

Figure 10:
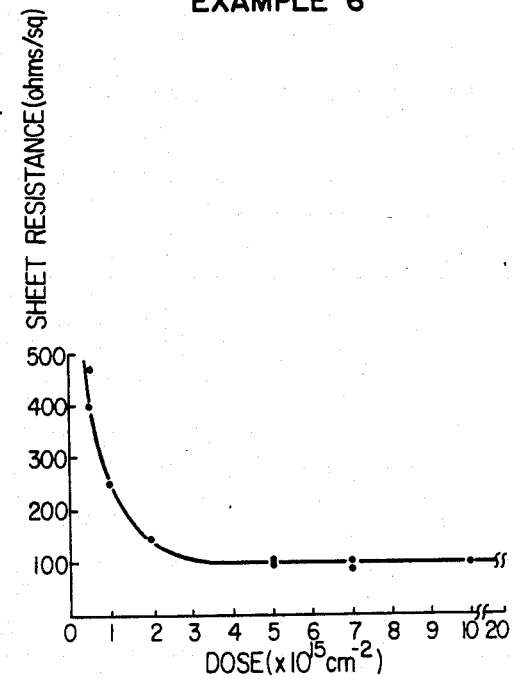
FIG. 10 is a graph of tin oxide sheet resistance versus phosphorus ion implantation dose, corresponding to Example 8.

In this example, phosphorus was implanted into a plurality of tin oxide films at implantation energies ranging from 120 to 150 keV. The implantation dose was varied from about 0.5 to about $10 \times 10^{15}$ cm$^{-2}$. A subsequent anneal step was performed at 800° C. FIG. 10 is a graph of sheet resistance versus phosphorus dose for this example. A large improvement in conductivity was obtained as the dose increased from 0.5 to about $2 \times 10^{15}$ cm$^{-2}$. There was little sheet resistance improvement above doses of $3 \times 10^{15}$ cm$^{-2}$ under these conditions, possibly indicating that the solid solubility of phosphorus in the tin oxide film is reached at this dosage level. At doses higher than those graphed, the sheet resistance actually increased to greater than 300 ohms per square. This may be due to the formation of a continuous amorphous SnO layer.

EXAMPLE 9

Figure 11:
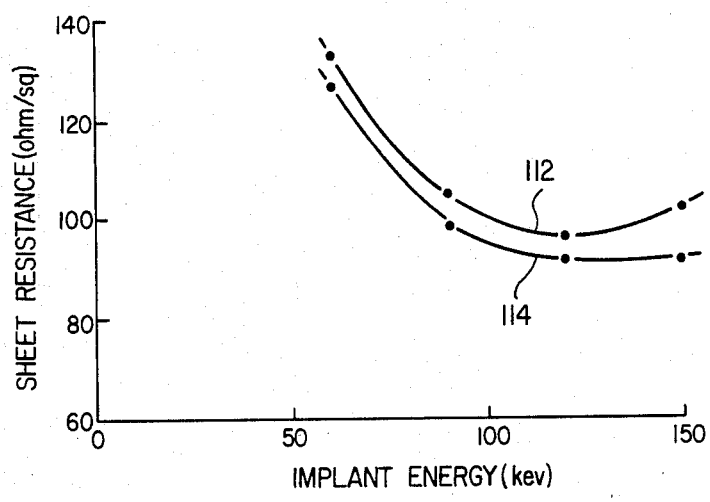
FIG. 11 is a graph of tin oxide sheet resistance versus implant energy, corresponding to Example 9.

In this example, the effects of varying the implantation energy on the resultant sheet resistance were studied. After implantation, an anneal step was performed at a temperature of 800° C. The results are shown in FIG. 11. Curve 112 represents data resulting from a phosphorus dose of $5 \times 10^{15}$ cm$^{-2}$; curve 114 results from data taken for a phosphorus dose of $7 \times 10^{15}$ cm$^{-2}$. Significant improvements in sheet resistance were obtained as the implantation energy was increased from about 60 to about 120 keV. This is because the lower-energy implants had a smaller "straggle" which results in a less uniform distribution and thus a higher sheet resistance.

EXAMPLE 10

Figure 12:
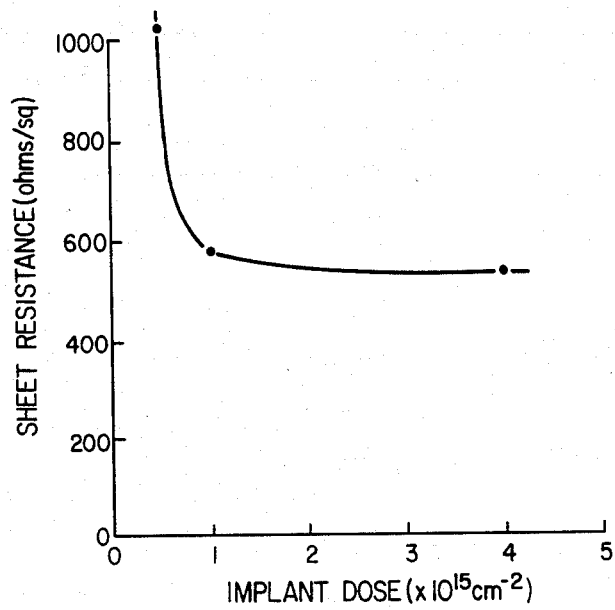
FIG. 12 is a graph of tin oxide sheet resistance versus arsenic ion implantation dose, corresponding to Example 10.

In this example, arsenic was used as the dopant and 180 keV was selected as the implant energy FIG. 12 is a graph of sheet resistance versus implant dosage A significant decrease in sheet resistance was obtained for values less than about $1 \times 10^{15}$ cm$^{-2}$. Sheet resistance thereafter leveled off as a function of dose. The lowest sheet resistance obtained was 542 ohms per square, approximately the same sheet resistance as is obtained with conventional tin oxide doping techniques. For 2600 angstrom films, this corresponds to a conductivity of 70 ohm$^{-1}$ cm$^{-1}$.

ADVANTAGES OF THE INVENTION

A principal advantage of the invention is the provision of a method for fabricating a single-level tin oxide layer that may be used to fabricate three-phase CCD imagers. A further advantage is provided by a novel low pressure chemical vapor deposition technique in depositing the tin oxide layer such that a good deposition rate and good uniformity are obtained. A further advantage is provided by a novel implantation step, whereby the sheet resistance of the tin oxide layer can be lowered to a value much lower than that obtained by conventional processes. A further advantage is that the process of the invention is compatible with the standard integrated circuit manufacturing techniques. A further advantage is the utilization of tin oxide's refractory properties in order to fabricate an electrode structure from which dopant does not diffuse in appreciable amounts under high subsequent anneal temperatures. Another advantage is provided by its simplified fabrication process relative to conventional processes for three-phase CCD imagers, in that only one layer of tin oxide need be deposited, and that no difficult and defect-inducing tin oxide etches need be performed. A further advantage results from the uniform tin oxide layer deposited, whereby no passivating layer on the top of the CCD imager is necessary. Yet another advantage is obtained by the use of tin oxide in the place of polysilicon, such that the undoped portions have a significantly higher resistivity, and such that the doped electrodes have a higher transparency. A further advantage is the discovery of optimum low pressure chemical vapor deposition conditions under which a maximum deposition rate of tin oxide may be achieved. Yet another advantage is the discovery of ion implantation conditions through which an optimum conductivity of tin oxide electrodes can be obtained.

While various embodiments of the invention and the advantages thereof have been described in detail, the invention is not limited to the above description but only by the scope and spirit of the appended claims.

What is claimed is:

1. A charge coupled device array, comprising
   a semiconductor layer;
   a gate insulator layer formed on said semiconductor layer;
   a normally insulative layer formed on said gate insulator layer;
   a plurality of conductive electrodes defining at least one row of charge-coupled devices, all of said electrodes formed in said normally insulative layer and horizontally spaced by predetermined electrode gaps having a width between electrodes of no greater than about one micron, said electrodes and said gaps formed by selectively doping said normally insulative layer after said normally insulative layer is formed on said gate insulator layer.

2. The array of claim 1, wherein said normally insulative layer is comprised of tin oxide.

3. The array of claim 1, wherein said predetermined electrode gaps are approximately one micron wide.

4. The array of claim 1, and further comprising at least three clocked inputs, each clocked input coupled to a different third of said plurality of electrodes such that a three-phrase charge coupled device array is formed.

5. The array of claim 1, wherein said electrodes have a conductivity selected from the range of about 285 to about 700 ohm$^{-1}$ cm$^{-1}$.

6. An imager array having a plurality of charge coupled devices formed in a plurality of rows and in a plurality of columns disposed at an angle to said rows, comprising:
 a semiconductor substrate;
 a plurality of parallel elongate channel stop regions formed in said semiconductor substrate to define said rows of charge coupled devices therebetween;
 a transparent gate insulator layer formed on said substrate;
 a tin oxide layer formed on said gate insulator layer;
 a plurality of electrodes formed by selectively doping said tin oxide layer, an electrode provided for each one of said columns;
 said electrodes uniformly horizontally spaced from each other by electrode gaps having a predetermined width.

7. The array of claim 6, and further including at least three clocked inputs, each clocked input connected to a different third of said electrodes, each third of said electrodes interdigitated among the remaining thirds of said electrodes such that a three-phase imager array is formed, said predetermined width of said electrode gaps being less than or equal to about one micron.

8. The array of claim 6, wherein said electrodes are doped to a conductivity selected from the range of about 285 to about 700 ohm$^{-1}$ cm$^{-1}$.

9. A method for manufacturing a charge-coupled device imager array, comprising the steps of:
 forming a transparent gate insulator layer on a semiconductor substrate;
 depositing a tin oxide layer on the gate insulator layer;
 selectively implanting the tin oxide with a dopant to form a plurality of spaced-apart conductive electrodes therein; and
 annealing the tin oxide layer.

10. The method of claim 9, wherein the step of depositing the tin oxide layer comprises depositing the tin oxide layer from a reactant gas mixture of tetramethyltin and oxygen at a low pressure and a high temperature.

11. The method of claim 10, wherein the temperature is selected from the range of 450° to 550° C.

12. The method of claim 10, wherein the low pressure is selected from the range of 0.3 to 1.1 torr.

13. The method of claim 10, and further inducing the steps of:
 placing the semiconductor substrate in a reactor vessel; and
 flowing the reactant gas through the chamber at a flux selected from the range of about 0.15 to about 1.1 standard cubic centimeters per minute per square centimeter of reactor cross-sectional area.

14. The method of claim 10, and further including the step of mixing the tetramethyltin with the oxygen in a molar ratio selected from the range of about 0.06 to about 0.60 to obtain the reactant gas mixture.

15. The method of claim 10, wherein the step of depositing the tin oxide layer includes the steps of:
 placing the semiconductor substrate with a plurality of like substrates in a heating zone having two ends; and
 maintaining a temperature gradient from one end of the heating zone to the other end thereof sufficient to obtain a uniform deposition rate.

16. The method of claim 9, and further including the step of:
 performing a light implant of the tin oxide layer prior to the step of masking the tin oxide layer.

17. The method of claim 9, and further including the step of:
 selecting a dopant for selectively implanting the tin oxide layer from the group consisting of arsenic, fluorine, boron difluoride, and phosphorus.

18. The method of claim 17, wherein the dopant is selected as phosphorus, said step of implanting further including the steps of:
 selecting an implantation energy from the range of 60 to 195 keV, and
 selecting an implant dose from the range of about $1 \times 10^{15}$ cm$^{-2}$ to about $1 \times 10^{16}$ cm$^{-2}$.

19. The method of claim 9, wherein said step of annealing the tin oxide layer is performed at a temperature selected from the range of 600° to 950° C. and for a period selected from the range of about 50 to about 200 minutes.

20. The method of claim 19, wherein said step of annealing step is performed under an oxygen atmosphere.

21. The method of claim 19, wherein said step of annealing is performed under a nitrogen atmosphere, the temperature selected to be less than 900° C.

22. A low-pressure chemical vapor deposition process for depositing a tin oxide film on a surface, comprising the steps of:
 placing at least one surface in a reactor chamber;
 mixing a minor proportion of tetramethyltin with a major proportion of oxygen to create a reactant gas mixture;
 introducing the reactant mixture into the chamber at a pressure ranging from 0.3 to 1.1 torr, a temperature ranging from about 450° C. to about 550° C. and a flux per unit reactor cross-sectional area from about 0.15 scm$^3$/cm$^2$-min to about 1.1 scm$^3$/cm$^2$-min; and
 depositing a film of tin oxide on the surface as a reaction product of the reactant mixture.

23. The process of claim 22, and further including the steps of:
 placing a plurality of surfaces similar to said at least one surface in a heating zone of a horizontal hot wall reactor said heating zone having two opposed ends, and
 maintaining a temperature gradient between said ends of about 20° C.

24. The process of claim 22, wherein the pressure is selected from a range of about 0.7 to about 1.1 torr.

25. The process of claim 24, wherein the pressure is maintained at about 1.1 torr.

26. The process of claim 22, wherein the molar ratio of tetramethyltin to oxygen is selected from the range of about 0.07 to about 0.60.

27. The process of claim 26, wherein the molar ratio of tetramethyltin to oxygen in the reactant gas mixture is selected from the range of about 0.07 to about 0.15.

28. The process of claim 27, wherein the molar ratio of tetramethyltin to oxygen is selected from the range of about 0.09 to about 0.11.

29. A process for reducing the sheet resistance of selected regions of a tin oxide layer, comprising the steps of:
selecting an implantation dopant from the group consisting of phosphorus, arsenic, fluorine, boron difluoride, and boron;
implanting the dopant into the regions at a dose selected from the range of about $1 \times 10^{15}$ cm$^{-2}$ to about $1 \times 10^{16}$ cm$^{-2}$, and an energy ranging from about 60 to about 195 keV; and
annealing the regions under an annealing atmosphere at a temperature ranging from 600° C. to 950° C.

30. The process of claim 29, and further including the step of:
annealing the regions under an oxygen atmosphere.

31. The process of claim 30, wherein the annealing temperature is approximately 800° C.

32. The process of claim 29, wherein the conductivity of the regions is raised to a value ranging from about 375 to about 420 ohm$^{-1}$ cm$^{-1}$.

33. The process of claim 32, wherein the sheet resistance is reduced to a value selected from the range of about 90 to about 105 ohms per square.

34. The process of claim 29, and further including the steps of:
performing a second implant into the regions; and
annealing the regions after the second implant in order to increase the conductivity of the regions to a value ranging from about 480 to about 700 ohm$^{-1}$ cm$^{-1}$.

35. The process of claim 34, wherein said second implant step is performed at an energy selected from the range of about 60 to about 195 keV, the second implant dopant dose approximating $5 \times 10^{15}$ cm$^{-2}$.

36. The process of claim 29, wherein the dopant comprises phosphorus.

37. The process of claim 36, wherein the step of implanting the dopant is performed at a dopant dose selected from a range of about $5 \times 10^{15}$ cm$^{-2}$ to about $1 \times 10^{16}$ cm$^{-2}$, and an implantation energy selected from the range of about 80 to about 195 keV.

38. The process of claim 37, wherein the dopant concentration is selected from the range of about $7 \times 10^{15}$ cm$^{-2}$ to about $1 \times 10^{16}$ cm$^{-2}$.

39. The process of claim 37, wherein the implantation energy is selected from a range of about 120 keV to about 150 keV.

40. The process of claim 29, wherein said annealing step is performed for a period selected from the range of 50 to 200 minutes.

41. The process of claim 40, wherein the anneal period is selected from the range of about 125 to about 175 minutes.

42. The process of claim 29, wherein said annealing atmosphere comprises nitrogen, the annealing temperature selected from the range of about 600° C. to less than 900° C.

43. The process of claim 42, wherein the annealing step takes place at a temperature of about 800° C.

44. The process of claim 29, and further comprising the steps of:
depositing a second layer of tin oxide;
implanting the dopant into selected regions of the second layer at an energy ranging from 90 to 150 keV the regions in the second layer overlying the regions in the layer; and
annealing the regions in the second layer under an annealing atmosphere at a temperature ranging from 600° C. to about 900° C., whereby a combined conductivity of the regions in the second layer and the layer of from about 275 to about 410 ohm$^{-1}$ cm$^{-1}$ is obtained.

* * * * *